(12) United States Patent
Penberth

(10) Patent No.: US 9,079,396 B2
(45) Date of Patent: Jul. 14, 2015

(54) METHOD OF DRIVING A CAPACITIVE LOAD AND DRIVE CIRCUIT THEREFOR

(75) Inventor: Michael Penberth, Cambridgeshire (GB)

(73) Assignee: Global Inkjet Systems Limited (GB)

( * ) Notice: Subject to any disclaimer, the term of this patent is extended or adjusted under 35 U.S.C. 154(b) by 0 days.

(21) Appl. No.: 14/240,476

(22) PCT Filed: Aug. 28, 2012

(86) PCT No.: PCT/GB2012/052102
§ 371 (c)(1),
(2), (4) Date: Mar. 31, 2014

(87) PCT Pub. No.: WO2013/030560
PCT Pub. Date: Mar. 7, 2013

(65) Prior Publication Data
US 2014/0240383 A1     Aug. 28, 2014

(30) Foreign Application Priority Data

Aug. 26, 2011   (GB) .................................. 1114812.9

(51) Int. Cl.
*B41J 29/38* (2006.01)
*B41J 2/07* (2006.01)
*H01L 41/04* (2006.01)
*H02P 31/00* (2006.01)
*B41J 2/045* (2006.01)

(52) U.S. Cl.
CPC ................ *B41J 2/07* (2013.01); *B41J 2/04548* (2013.01); *B41J 2/04581* (2013.01); *H01L 41/042* (2013.01); *H02P 31/00* (2013.01)

(58) Field of Classification Search
CPC ...................................................... B41J 2/04541
USPC ............. 347/10; 323/247, 267, 268, 287, 290
See application file for complete search history.

(56) References Cited

U.S. PATENT DOCUMENTS

| | | | |
|---|---|---|---|
| 6,563,252 B2 | 5/2003 | Schrod | |
| 7,667,371 B2 | 2/2010 | Sadler et al. | |
| 8,860,388 B2 * | 10/2014 | Penberth | ....................... 323/271 |
| 2004/0145273 A1 | 7/2004 | Khoury | |
| 2005/0225202 A1 | 10/2005 | Vogeley et al. | |
| 2009/0090333 A1 | 4/2009 | Spadafora | |

FOREIGN PATENT DOCUMENTS

| | | |
|---|---|---|
| DE | 19958262 | 7/2001 |
| EP | 2254170 | 11/2010 |

* cited by examiner

*Primary Examiner* — Julian Huffman
*Assistant Examiner* — Sharon Polk
(74) *Attorney, Agent, or Firm* — Hartman Global IP Law; Gary M. Hartman; Donald N.S. Hartman

(57) ABSTRACT

A method for driving a capacitive load using a target voltage waveform having a peak voltage and an average rise and fall slew rate, wherein the average rise and fall slew rates comprise at least one voltage step, the method comprising supplying power from an input to an output for charging a capacitive load to obtain a peak voltage and average rise slew rate in response to the target waveform; discharging the capacitive load to obtain an average fall slew rate in response to the target waveform, and returning the discharged power from the capacitive load to the input.

19 Claims, 2 Drawing Sheets

METHOD OF DRIVING A CAPACITIVE LOAD AND DRIVE CIRCUIT THEREFOR

CROSS REFERENCE TO RELATED APPLICATIONS

This application claims the benefit of International Application No. PCT/GB2012/052102 filed Aug. 28, 2012, having a claim of priority to GB patent application number 1114812.9, filed Aug. 26, 2011.

This invention relates to a method and drive circuit for driving capacitive loads, for example piezo-electric actuators for print head arrays.

Piezoelectric material acts as a capacitive load and the capacitance is proportional to the number of piezoelectric actuators actuating in an array at any one time. A print head array can comprise such piezoelectric actuators. Piezoelectric material has various marked advantages over alternative mechanical actuators including a small size, low power consumption and high speed responsiveness.

A number of drive circuits for driving such piezoelectric actuators are disclosed in the art. For example U.S. Pat. No. 4,749,897 discloses a drive circuit used to control the mechanical displacement of the piezoelectric element to a desired target value, whereby the amount of energy stored in a transformer is controlled so as to control the mechanical displacement of the piezoelectric element. However, the transformer used to provide such functionality is required to be very large in size so that it can store a large amount of energy when a high speed response and high energy are demanded for controlling the displacement of the piezoelectric element. Such large transformers are impractical in everyday circuits, and controlled charging/discharging of load in a circuit having such large transformers will require complex safety circuitry.

For accurate control, it will be apparent that the drive voltage waveform should have highly controlled average rise and fall slew rates, being of the order of a few V/μsecs. U.S. Pat. No. 5,036,263 discloses a drive circuit for a piezoelectric material using a plurality of pulse signals to charge a capacitor to a sufficient charge, and using the energy stored in the capacitor to charge a piezoelectric actuator. However, such a circuit does not provide accurate control of the rise and fall slew rate of the voltage waveform applied to the piezoelectric actuator, and therefore control of the actuator will be limited.

Accordingly, in a first aspect, there is provided a method for driving a capacitive load using a target voltage waveform, the target voltage waveform having a trace comprising a peak voltage and an average voltage risetime component and voltage falltime component, wherein the trace comprises at least one voltage step on each of the voltage risetime and falltime components, the method comprising: sensing a voltage value representative of a voltage value on the capacitive load; substantially continuously comparing the sensed voltage value with the target voltage waveform; supplying power from an input to an output for charging a capacitive load to obtain a peak voltage and average rise slew rate in continuous response to the comparison of the sensed voltage value with the target voltage waveform; discharging the capacitive load to obtain an average fall slew rate in continuous response to the comparison of the sensed voltage value with the target voltage waveform, and returning the discharged power from the capacitive load to the input.

The advantage of such a method being that the capacitive load is driven in a controlled, regulated and predetermined manner. Furthermore, driving a variable capacitive load with a predetermined voltage waveform having average rise and fall rates removes the requirement for unnecessarily large power supplies.

Furthermore, power used for charging the capacitive load is recycled in the system by returning the power from the discharging capacitive load to the input. Using such functionality ensures that the average power drawn from the power supply is that required only to supply losses in the system.

Preferably, the method further comprises: enabling a first charge path between a power supply and an inductance and a first discharge path from the inductance so that the inductance is charged from the power supply; disabling the first charge path and selectively enabling and disabling the first discharge path so that current flows from the inductance to the capacitive load via a second charge path to achieve the average rise slew rate; selectively enabling and disabling a second discharge path so that the capacitive load discharges via a primary side of a transformer to achieve the average fall rate, whereby voltage is induced on a secondary side of the transformer and is used to recharge the power supply.

Thus, further advantages of the present invention are that by using the drive circuit described above, the circuit can adapt to the requirements of a variable capacitive load(s) by pulse width modulating (PWM) a fixed charge/discharge current so that the average current equates to that needed by the load(s).

Preferably, the method further comprises: comparing the current on the first discharge path with a predetermined set current value and selectively enabling and disabling the first charge path so as to attempt to maintain a predetermined level of charge on the inductance; and comparing the charge on the load with the target voltage waveform and selectively disabling the first discharge path and disabling and the second discharge path so as to charge the capacitive load.

Advantageously, the inductance maintains a predetermined level of charge providing sufficient charge in the inductance to achieve the average slew rate and peak voltage within a determined time period.

According to a second aspect, the invention provides a drive circuit for driving a capacitive load using a target voltage waveform, the target waveform having a trace comprising a peak voltage and an average voltage risetime component and average voltage falltime component, wherein the trace comprises at least one voltage step on each of the voltage risetime and falltime components, the circuit comprising: an input for coupling to a power supply; an inductance having a first electrode connected to the input via a first charge path including a first switching device, and a second electrode connected to a first discharge path including a second switching device and to an output of the circuit for selectively charging a capacitive load via a second charge path; a transformer having a primary side connected between a second discharge path including a third switching device and the output of the circuit for selectively discharging the capacitive load, the transformer further having a secondary side connected to the input; and a controller connected to the first, second and third switching devices.

The advantage of such a circuit being that the capacitive load is driven in a controlled, regulated and predetermined manner. Furthermore, driving a variable capacitive load with a predetermined voltage waveform having average rise and fall rates removes the requirement of large power supplies. Furthermore still, having a discharge path from the capacitive load to the input enables the system to return the discharged power from the capacitive load to the input. Such functionality negates the requirement for highly complex control circuitry to safety remove the heat which would otherwise be present in the system.

Preferably, in use and in response to the target waveform the controller: enables the first charge path and the first discharge path so that the inductance is charged from the power supply; disables the first charge and second discharge path and selectively enables and disables the first discharge path so that current flows from the inductance to the output for charging the capacitive load via the second charge path to achieve an average rise slew rate and peak voltage; selectively enables and disables the second discharge path, so that the capacitive load discharges to the input via the primary and secondary sides of the transformer to achieve the average fall slew rate. The circuit comprises a voltage divider circuit for sensing the voltage on the capacitive load.

Thus, further advantages of the present invention are that by using the drive circuit described above, the circuit can adapt to the requirements of a variable capacitive load(s) by pulse width modulating (PWM) a fixed charge/discharge current so that the average current equates to that needed by the load(s).

Preferably, the drive circuit further comprises a first differential comparator having a first input connected to the first discharge path, a second input connected to the controller for receiving a predetermined set value from the controller and an output, whereby the differential comparator compares the current on the first discharge path with the predetermined set value, whereby a signal from the output of the first differential comparator is capable of controlling the first switching element to attempt to maintain a predetermined level of charge on the inductance.

The first differential comparator ensures that the circuit attempts to maintain a set charge on the inductor even when the circuit is in the process of charging/discharging the load.

Preferably, the drive circuit further comprises a second differential comparator having a first input connected to the voltage divider circuit and a second input connected to the controller for receiving the target waveform from the controller and an output, whereby the second differential comparator compares the voltage on the capacitive load with the target waveform and, whereby a signal from the output of the second differential comparator is capable of controlling the switching elements to control the charging and discharging of the capacitive load.

The second differential comparator enables the system to compare the attenuated voltage with the target input waveform and its output is used by the controller to determine the functionality of the circuit.

Preferably, the drive circuit further comprises a capacitor in parallel with the capacitive load, and wherein, a blocking component is connected between the first charge path and ground. The blocking component is a semiconductor device such as a MOSFET transistor and/or a diode and, wherein the switching devices are semiconductor devices such as MOSFET transistors.

The capacitor in parallel with the capacitive load enables operation of the drive circuit at zero capacitance load.

Preferably, a fourth switching element selectively controls the operation of voltage divider circuit, wherein the fourth switching element is controllable by the controller.

The fourth switching element is placed across a component of the voltage divider circuit to discharge that component. The voltage divider, which is referenced to ground, may be a pair of capacitors connected in series to each other and in parallel to the load. Therefore, in placing a switching element across a capacitor it is possible to discharge that capacitor, thereby resetting the voltage divider. However the voltage dividers may comprise of resistors, capacitor or inductors or any combination thereof.

Preferably, the controller is communicable with external devices and wherein the controller comprises a plurality of discrete devices communicable with each other.

In being communicable with external devices, the controller can be used to receive instructions from various resources, for example a person, the internet, data libraries.

Preferably, the average voltage risetime component comprises at least one rise period and the average voltage falltime component comprises at least one fall period, the rise and fall periods each having at least one 'on' duration and 'off' duration.

By using stepped voltage waveforms having defined steps in the circuit, it is possible to control the charging of the load in order to achieve higher predetermined load voltages than would normally may achieved.

One embodiment of the invention will now be more fully described, by way of example, with reference to the drawings, of which:

Figure 1:
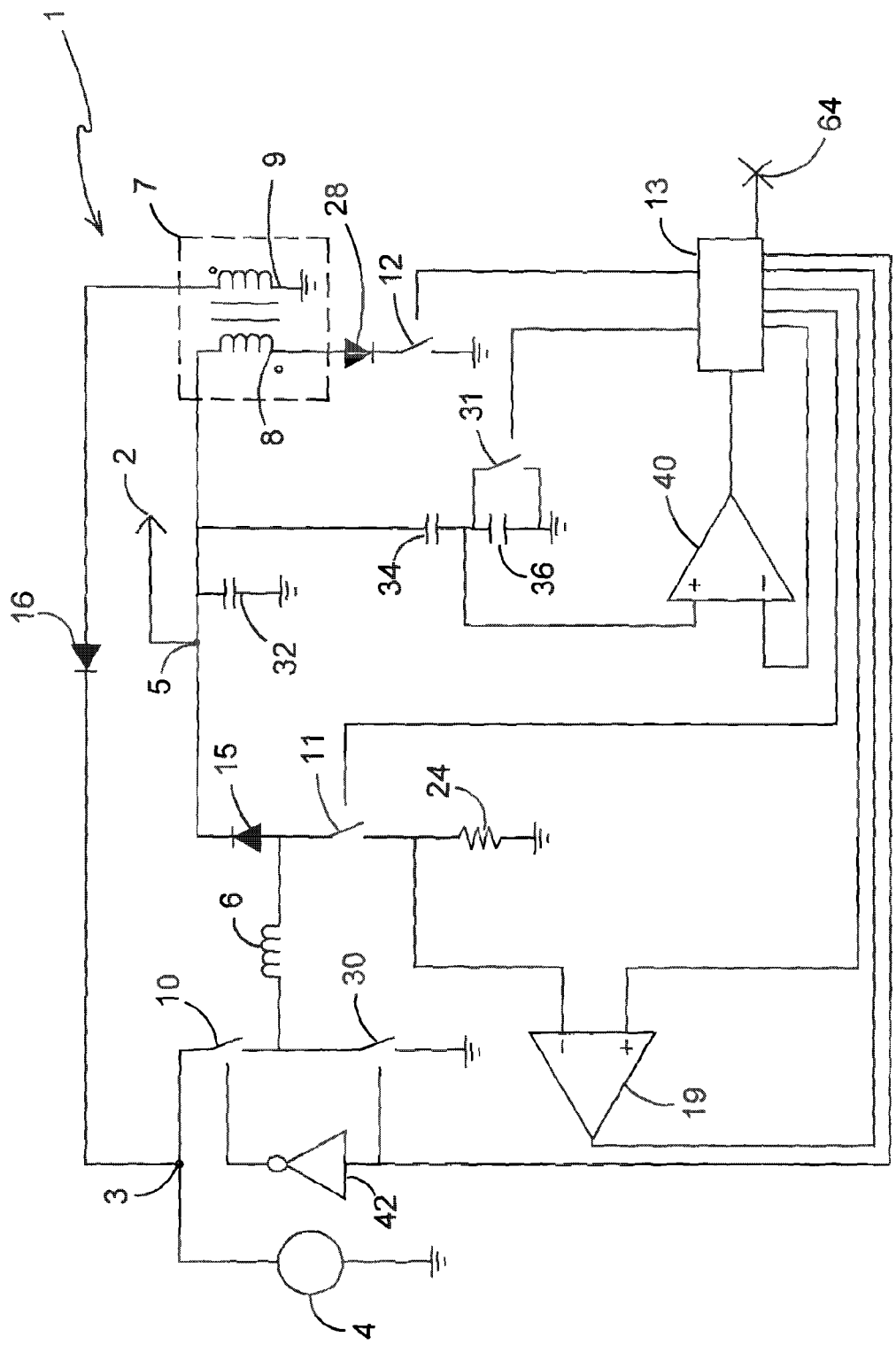
FIG. 1 shows a schematic diagram of a drive circuit.

FIG. 1 shows a schematic diagram of a drive circuit. Specifically, FIG. 1 describes a drive circuit 1 that is capable of driving a variable capacitive load 2 using a predetermined target waveform of 150V. The target waveform is described in detail below with reference to FIGS. 2a, 2b and 2c. Although the target waveform used for this embodiment is a relatively high voltage, any range of suitable voltages could be used.

The capacitive load 2 may be a piezoelectric actuator, or other such capacitive load(s). The capacitance of capacitive load 2 used for this embodiment is in the range of up to 20 nF, but, depending on the application the drive circuit is used for, is not limited to such a range.

The drive circuit 1 includes an input 3 connected to a power supply 4, an output 5, connected to the capacitive load 2, an inductance 6 connected between the input 3 and the output 5, and a transformer 7 connected between the output 5 and the input 3 in parallel with the inductance 6. The transformer comprises a first inductor, i.e. the primary side 8 coupled to a second inductor, i.e. the secondary side 9 such that the transformer 7 acts as a flyback transformer in the circuit. Such flyback transformer arrangements are well known to skilled persons. The power supply used for this embodiment is a 24V power supply but, depending on the application, is not limited to 24V.

The drive circuit 1 further includes a first switching element 10, connected between the input 3 and a first electrode of the inductance 6 to selectively enable and disable a first charge path between the input 3 (and hence the power supply 4 and the inductance 6. The drive circuit 2 further comprises a second switching element 30 connected between the first charge path and ground, after the first switching element 10 and before the inductance 6. The operation of the first and second switching elements 10 and 30 are mutually exclusive. The functionality of the drive circuit 1 is maintained if the switching element 30 is replaced by a diode having its anode connected to ground and its cathode connected to the first charge path.

Additionally, a third switching element 11, is connected between a second electrode of the inductance 6 and ground, via a resistor 24, to selectively enable and disable a first discharge path, whilst a second charge path includes a diode 15, having its anode connected to the second electrode of the inductance 6 and its cathode connected to the output 5.

A fourth switching element 12 is connected between a first electrode of the primary side 8 of the transformer 7 and ground to selectively enable and disable a second discharge path for discharging the capacitive load 2 through the primary side 8 of the transformer 7 whereby a second electrode of the primary side 8 of the transformer 7 is connected to the output 5.

A controller 13 is provided in the drive circuit for controlling the switching elements 10, 11, 12, 30. The switching elements 10, 11, 12, 30 are preferably implemented as circuit elements including a transistor, which may be an N channel MOSFET (e.g International Rectifier IRF6785), and may include other components as required to function as required, as will be appreciated by person skilled in the art, e.g. resistors, capacitors and/or a high speed half bridge drive (LTC4444) for driving the MOSFET. For the present embodiment the controller 13 uses pulse width modulation (PWM) signals to control the switching elements 10, 11, 12 and 30 and such functionality is described below.

The second discharge path includes a diode 28 having its anode connected to the first electrode of the primary side 8 of the transformer 7 and its cathode connected to the fourth switching element 12. A diode 16 is provided between the secondary side 9 of the transformer 7 and the input 3, with its anode connected to the secondary side 9 of the transformer 7 and its cathode connected to the input 3. It should be seen therefore, that the cathode of the diode 16 is, in effect, capable of being connected to the power supply 4 when connected to the input 3.

Furthermore, a capacitor 32 connected between ground and the second discharge path, between the output 5 and the primary side 8 of the transformer 7, and is, therefore, placed in parallel with the capacitive load 2. The capacitor 32 provides a fixed capacitance in order to reduce the total variation on the load 2, thus ensuring that the overall current range required by the capacitive load 2 is within practical limits for such a circuit. For the present drive circuit capacitor 32 is 10 nF, and, therefore, using a 10 nF capacitor 32 in conjunction with the 20 nF capacitive load 2 reduces the current range required to power the load to approximately 3:1. Furthermore, the capacitor 32 ensures the drive circuit 1 is capable of functioning when the capacitance of the capacitive load 2 is 0 F (zero Farads).

When the first and third switching elements 10, 11 are closed, the first charge path between the input 3 and the first electrode of the inductance 6 and the first discharge path between the second electrode of the inductances and ground is enabled, and the inductance 6 is charged from the power supply 4, via input 3. Whilst charging the inductance 6, the second and fourth switching elements 30, 12 should be open. Once the inductance 6 is charged it can be used to charge the capacitive load 2. This occurs by opening the first and third switching elements 10 and 11, whilst maintaining the fourth switching element 12 in an open position. Thus, the inductor current will flow through the diode 15 via the output 5 to charge the capacitive load 2. To stop charging the capacitive load 2, the third switching element 11 is closed.

To discharge the capacitive load 2, the fourth switching element 12 is closed, thereby allowing the capacitive load 2 to discharge through the second discharge path including the primary side 8 of transformer 7 and diode 28 to ground. As the capacitive load 2 discharges though the primary side 8 of transformer 7, energy is stored in the primary side 8 of the transformer 7. It should be seen that when the switch 12 is closed, the diode 16 is reverse biased. Discharging the capacitive load through the primary side 8 will induce a voltage over the secondary side 9, but as the diode 16 is reverse biased no current will flow on the secondary side 9. When the switch 12 is reopened, the diode 16 becomes forward biased and the energy stored in the primary side 8 transfers to the secondary side 9 through diode 16 and back to the power supply 4 via the input 3.

It is evident that such charging/discharging functionality requires strict regulation to ensure the inductance 6 is charged/discharged as required, and further to ensure that the capacitive load 2 is charged/discharged as required.

Therefore, in order to control the charging of the inductance 6 from the power supply 4, a differential current comparator 19 is used to compare the current in the first discharge path with a predetermined set value provided by the controller 13. A negative input of the differential current comparator 19 is connected to the first discharge path between the second switching element 11 and the resistor 24, whilst a positive input of the differential comparator 19 is connected to the controller 13 for receiving the predetermined set value of the required current from the controller 13. An output of the differential comparator 19 is used to as an input to the controller 13 such that it can control the switching elements 10, 11, 12, 30 dependent on the output from the differential comparator 19.

When the switching elements 10 and 11 are closed, the inductance 6 will charge and the level of charge will be sensed by the resistor 24. The differential current comparator 19 compares the level of charge sensed on the resistor 24 with a set level from the controller 13 and when the current level in the inductance 6 has reached the predetermined level, the switch 10 is opened thereby preventing further charging of the inductance 6. The inductance 6 will attempt to maintain current flow, and current will continue to flow through the first discharge path with a decay rate dependant on the resistive drop of the resistor 24. Thus, if the current level falls below the required level, the first switching element 10 will be closed and the inductance 6 will be charged as before to the set level.

The current comparator circuit 19 is provided with a level of hysteresis so recharging will only restart when the charge in the inductance 6 has decayed by the hysteresis level. The differential comparator 19 may be a Maxim Ultrahigh speed comparator (MAX961), and it will be known to a person skilled in the art that the differential comparator 19 may require additional circuitry to ensure correct functionality depending on the application such as, for example resistors, capacitors, power supply capabilities and ground points.

To control the operation of the first and second switching elements 10, 30, a NOT gate 42 (e.g. Texas Instruments SN7404N), is placed between the first and second switching elements 10, 30 to control the elements 10, 30 such that their operation is mutually exclusive based on the output from the differential comparator 19.

However, other configurations/elements could be used to control the operation of the switching elements 10, 30. For example using the output of the differential comparator 19 as an input to a MOSFET drive (e.g. LTC4444), and using the MOSFET drive to control the switching elements 10, 30 based on the output of the differential comparator 19 will provide similar functionality.

Furthermore, in order to regulate the charge/discharge functionality of the capacitive load 2, two sensing capacitors 34 and 36, connected in series between the second discharge path and ground, are located in parallel with the capacitor 32, thereby forming a voltage divider circuit. Whilst in this embodiment the voltage divider comprises a pair of capacitors connected in series to each other, the voltage divider may be constructed of resistors, capacitors or inductors or any combination thereof as will be known to a person skilled in the art.

It should be seen that an attenuated load output value can be sensed in the voltage divider circuit and subsequently used as an input to a differential comparator 40. It will be seen that the level of attenuation is determined by the ratio of the capacitance values of capacitors 34 and 36. For example, if values of 100 pF and 3.3 nF are used for capacitors 34 and 36 respectively, the attenuation ratio is 1:34, thereby giving 4.412 V at the positive input of the differential comparator 40 which represents 150V on the capacitive load 2. Any voltage divider circuit could be used to sense the attenuated voltage on the capacitive load.

Additionally, a fifth switching element 31, also controllable by the controller 13, is placed across the capacitor 36, such that the capacitance on the capacitor 36 can be reset to, or held at zero as required. It will be seen that the resetting/holding functionality may also be achieved using any suitable means.

As described above, the positive input of the differential comparator 40 is connected between the capacitors 34 and 36 whilst the negative input of the differential comparator 40 is connected to an output from the controller 13. Furthermore, the output of the differential comparator 40 is connected to an input of the controller 13. Therefore the attenuated output load voltage on the capacitor 36 can be compared with a signal from the controller 13, and the output of the differential comparator 40 can be used by the controller 13 to control the switching elements 10, 11, 12, 30 and 31. The differential comparator 40 may be a Maxim MAX961 Ultrahigh speed comparator, and it will be known to a person skilled in the art that the differential comparator 40 requires additional circuitry e.g. resistors, capacitors, power supply capabilities and ground points to achieve desired functionality depending on the application.

Figure 2A:
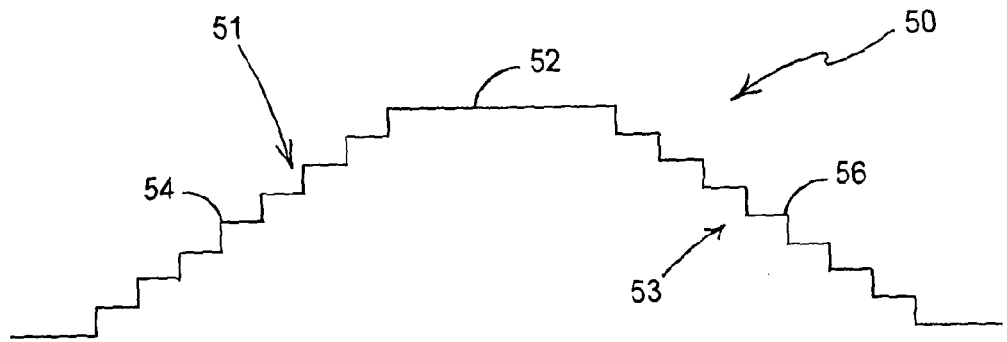
FIG. 2a shows a trace of a target input voltage waveform for use in the circuit of FIG. 1.
Figure 2B:
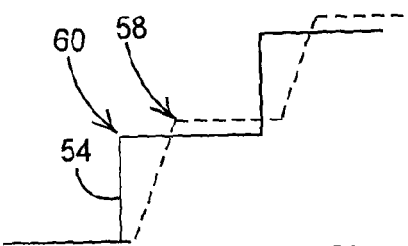
FIG. 2b shows a trace representing a plurality of rising steps of a target input voltage waveform superimposed on an output trace from the circuit of FIG. 1.
Figure 2C:
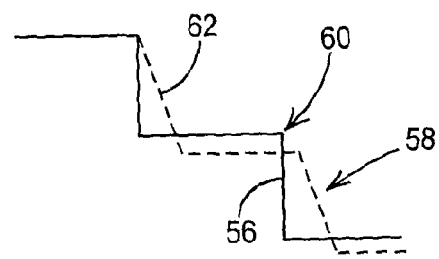
FIG. 2c shows a trace representing a plurality of falling steps of a target input voltage waveform superimposed on an output trace from the circuit of FIG. 1.

FIG. 2a shows a trace of a target input voltage waveform 50 for use in the drive circuit 1; FIG. 2b shows a trace representing a plurality of rising steps of a target input voltage waveform superimposed on an output trace from the drive circuit 1, whilst FIG. 2c shows a trace representing a plurality of falling steps of a target input voltage waveform superimposed on an output trace from the drive circuit 1. Reference to elements of FIG. 1 will be made when describing the steps required for obtaining desired functionality.

The input voltage waveform 50 comprises average rising and falling slew rates 51 and 53, defined by a plurality of rising voltage steps 54, falling steps 56 and a peak voltage 52. Typical average rise and fall slew rates 51, 53 used for this embodiment are in the range of 40-50 V/μsec.

Each voltage step 54 and 56 of the input voltage waveform 50, comprises an 'on' period and an 'off' period, whereby for the rising voltage steps 54, the 'on' period is defined by a sharp voltage rise whilst the 'off' period is defined by substantially zero voltage. Conversely, for the falling voltage steps 56, the 'on' period is defined by a sharp voltage drop whilst the 'off' period is defined by substantially zero voltage. Each 'on' period of the rising voltage steps 54 defines the period for which the capacitive load 2 is to be charged, whilst each 'on' period of the falling voltage steps 56 defines the period for which the capacitive load 2 is to be discharged.

As described above in relation to FIG. 1, a target input voltage waveform 50, as required by the user to drive the capacitive load 2, is applied to the negative input of the differential comparator 40 by the controller 13. The input voltage waveform 50 will be compared with the attenuated value on its positive input of the differential comparator 40 and the output will define the operation of the switching elements 10, 11, 12 30 and 31.

Prior to charging the capacitive load 2 as defined by the input voltage waveform 50, the drive circuit 1 will charge the inductance 6 such that the set current is a function of the total load capacitance, required voltage slew rate and peak voltage.

However, the minimum value for the current in the inductance 6 is defined by the required slew rate of the input voltage waveform 50. Therefore, in the present embodiment, a minimum current of 1.2 amps is required to achieve a slew rate of 40 V/μs for a 30 nF capacitive load (capacitive load 2 (20 nF)+capacitor 32 (10 nF)).

When the capacitive load 2 is to be charged for the 'on' period 54 of the first step of the voltage input waveform 50, the first, third, fourth and fifth switching elements 10, 11, 12, 31 of the drive circuit 1 are held open by the controller 13 thereby enabling the second charge path, and current in the inductance 6 will flow through the diode 15 charging the capacitive load 2 and the capacitor 32. As described in detail above, an attenuated voltage will appear across the capacitor 36 through the capacitor 34, thereby providing attenuated voltage values 58 on the positive input of the differential comparator 40. The differential comparator 40 will compare the attenuated value with the voltage input waveform 50 and once the attenuated voltage value 58 is equal to the target input value 60 (i.e. the capacitive load 2 is charged sufficiently), the third switching element 11 is closed by the controller 13, for the duration of the 'off' period of the first step. The third switching element will turn on again for the next 'on' period and such functionality is repeated until all rising voltage steps defining the average rise slew rate are completed, thus resulting in an overall average rise slew rate 51, and peak voltage 52. Once the peak voltage 52 of the target input waveform 50 has been achieved, the third switching element 11 is closed and no further current will be drawn by the capacitive load 2.

It should be seen that when the switching element 11 is closed, the charge on the inductance 6 is monitored by the differential comparator 19 sensing the current on the resistor 24, such that if the charge on the inductance falls below a set predetermined level, as defined by the controller 13, the first switching element 10 is closed such that the inductance 6 is re-charged for the duration of the 'off' period of the rise time. As described above, the first and third switching elements 10, 11 are reopened in response to an 'on' period of the target waveform and charging of the inductance will cease. Alternatively, if the inductance 6 is charged to the predetermined set level within the 'off' period, the first switching 10 element is re-opened by the controller 13 and charging of the inductance is ceased.

Once the peak voltage has been achieved, the next stage is the first voltage step 56 of the fall slew rate 53; for the falling voltage steps 56, when the attenuated voltage value 58 on the positive input of the differential comparator 40 is higher than the voltage of the target input voltage 60 the fourth switching element 12 is closed, thereby providing a discharge path for the capacitive load 3 through the primary side 8 of transformer 7.

As described above, during discharge and whilst switching element 12 is closed, diode 16 is reversed biased and energy is stored in the primary side 8 of the transformer 7. When the attenuated voltage value 58, as sensed across capacitor 36 on the positive input of the differential comparator 40, equals the voltage of the target input voltage 60, the fourth switching element 12 is re-opened, thereby preventing further discharge of the capacitive load 2. When the switch 12 is reopened, the diode 16 becomes forward biased and the stored energy therein is transferred from the primary side 8 to the secondary side 9 and the energy is returned to the input 3 to be returned to the power supply 4.

Such functionality is repeated until all falling voltage steps are completed thus resulting in an overall average fall slew rate 53.

This average rise and fall slew rate 51, 53 and peak voltage 52 provides the required drive waveform for the capacitive load 2, regardless of whether the capacitive load 2 varies. Therefore, it should be seen that by pulse width modulating (PWM) a fixed charge/discharge current, the average current equates to that needed.

It should be seen from FIGS. 2b and 2c that there is an overshoot between the attenuated voltage values 58 and the target input values 60. It will be evident to a skilled person that such an overshoot occurs because the components of the drive circuit 1 are not ideal components and there will invariably be a delay in the operation of the components of the drive circuit 1 such as, for example, the switching elements 10, 11, 12, 30, 31 differential comparators 19, 40 and controller 13. Such delays are accounted for in the choice of components used in the drive circuit 1. Whilst one advantage of the overshoot is seen in the comparator 40 hysteresis which prevents oscillation of the switching elements 10, 11, 12 and 30, such an overshoot sets a limit on the number of steps that can be used in the target waveform 50 as the step duration must be significantly longer than the propagation delay of the overshoot.

With reference to suitable inductance 6 values, the inductance 6 must store sufficient energy such that there is sufficient current in the inductance 6 to complete the final voltage step within the step time, whilst the initial current must be low enough that the time to charge to the first voltage step on the target input voltage waveform is greater than the reaction time of the differential comparator 40 and the third switching element 11.

Furthermore, the current in the inductance 6 will fall whilst charging the capacitive load. The energy to be transferred is $0.5CV^2$ (0.3375J). Therefore, the inductance must store this amount of energy and still maintain a current of 1.2 A at the end of the charging step. It is evident therefore that the initial energy stored in the inductance 6 must allow for the energy to be transferred plus the residual energy to maintain the minimum charging current. Demonstrating such functionality in equation terms using $I_i$ as the initial current:

$$0.5 * L * I_i^2 - 0.5 * L * (1.2)^2 = 0.3375 * 10^{-3}$$

If the initial current is set at twice the minimum current (2.4 amps) the value of the inductor can be calculated:

$$L = 0.3375 * 10^{-3} / (0.5 * (2.4^2 - 1.2^2)) = 468.75 u\text{Henries}$$

Similarly, and with reference to calculating the values for the primary side 8 of the transformer 7, the combined switch reaction time of the differential comparator 40, the controller 13 and the fourth switching element 12 sets a suitable range of values for the transformer 7.

Specifically, the current in the primary side 8 of the transformer 7 must rise slowly enough that the voltage fall during the combined switch reaction time is less than a falling output voltage step 62 whilst being fast enough to complete the falling output voltage step 62 within the step time. Furthermore, the primary side 8 is a coupled inductor effectively operating in flyback mode, as is evident to a person skilled in the art. At the start of the discharge of the capacitive load 2, the current in the primary side 8 is effectively zero. In order to maintain the 40 V/μs fall slew rate 53 it must rise to an average of 1.2 A. Therefore, the rise time for 150V at 40 V/μs is 3.75 μs and if the target waveform has 20 steps then each step is 187.5 ns. The first discharge step will apply 150V across the inductor and the current must reach a minimum of 2.4 A to provide an average of 1.2 A for the duration of the step. Such requirements set a maximum value for the inductance of the transformer 7 which can be calculated using the equation $$e = L \frac{di}{dt}$$

where:
L=Inductance
E=Voltage applied to the inductor=150V
di=DC current of the inductor=2.4 A
dt=Charge time=187.5 ns
Rearranging the equation to $$L = e \frac{dt}{di}$$

and using the values above:

$$L = 150V * 187.5e^{-3}s/2 < A = 11.7u\text{Henries}$$

The second fall step will start with a discharge current of 2.4 amps and will discharge to the target voltage in less than half the step time, for the remainder of the step time the coupled winding of the inductor will discharge into the power supply 4. Using such functionality ensures that the average energy drawn from the power supply 4 is that to supply losses in the system.

If the transformer 7 was operating in steady state continuous current mode then the normal duty cycle equation for a flyback converter would apply:

$$D = Vo(Vo + Vi) \text{where:}$$

Vo is the supply voltage=24V
Vi is the capacitor voltage=150V
D is the duty cycle
Therefore, D is initially 24/174=0.14

When the combined capacitor voltage (capacitive load 2+capacitor 32) approaches zero, the duty cycle D will rise to approximately 1.

Since the average discharge current required is 1.2 amps, the peak current at 0.14 duty cycle is 8.6 amps. However, it would take several steps to ramp to this level during which time the combined capacitor voltage would have fallen and the duty cycle increased.

Maximum current occurs approximately half way through the discharge (75 volts) where the duty cycle is 0.24 and the current is 5 amps, and, therefore, the transformer 7 must be rated accordingly as known to a person skilled in the art.

It should be evident that the controller 13 has communication means 64 such that the controller 13 is communicable with various external circuits/devices, and can receive instructions therefrom, and provide instructions thereto. Such external circuits/devices may comprise computers, networks and/or modems so as to control the switching elements 10, 11, 12, 30, 31 in response to user inputs, or other such suitable circuits/devices known to persons skilled in the art for controlling circuits/devices. Such user inputs may be in the form of target waveforms which themselves may be in the form of software stored on the controller 13 or on an external circuit/device. Although depicted as a single combined entity, the controller 13 may comprise a number of discrete devices.

Thus, the advantages of the present invention are that by using the drive circuit described above, the circuit can adapt to the requirements of a variable capacitive load(s) by pulse width modulating (PWM) a fixed charge/discharge current so that the average current equates to that needed by the load(s). Furthermore, the slew rates and predetermined voltages of the waveforms may be dynamically modified as required to generate waveforms for a multitude of applications.

Furthermore, an inductance is used for charging the capacitive load, whereby energy used for charging the capacitive load is recycled in the system, by returning the energy from the discharging capacitive load to the power supply. Using such functionality ensures that the average energy drawn from the power supply is that required only to supply losses in the system Additionally, the reduction in power required for a device using the present invention, in comparison to a device not using the present invention, allows for low voltage power supplies, smaller heat dissipaters and less complex heat control circuitry to be used, resulting in increased cost and space savings.

It will be appreciated that although only one particular embodiment of the invention has been described in detail, various modifications and improvements can be made by a person skilled in the art without departing from the scope of the present invention. For example, although a MOSFET has been used as an example of a switching element, it will be appreciated that this is not intended to mean that other devices could not be used instead. Furthermore, the circuit has been described in schematic form to enable it to be easily understood by a person skilled in the art. Nevertheless, it will be appreciated that other components and devices may well be utilised in the circuit, if desired.

Furthermore, although the input voltage waveform has been described as a symmetrical trapezoid, it will be appreciated that various waveforms may be used whereby the slew rate may vary through the rise and fall rates.

One area in which such drive control circuitry is an advantage is in inkjet printing applications, which require high speed, high control and high energy efficiency. In such applications piezo-electric material is used to deform/actuate a single nozzle chamber containing ink.

When a voltage waveform is applied to the piezoelectric material, the piezoelectric material deforms, thus causing a deformation in the nozzle chamber and resulting in a droplet of ink being ejected from the chamber onto a substrate. Therefore it should be seen that the ejection of the ink droplets from the nozzle chamber is defined by the voltage waveform applied to the piezoelectric material. By using such techniques, printed characters may be created on the surface of the substrate in a highly controlled manner.

The invention claimed is:

1. A method for driving a capacitive load using a target voltage waveform, the target voltage waveform having a trace comprising a peak voltage and an average voltage risetime component and voltage falltime component, wherein the trace comprises at least one voltage step on each of the voltage risetime and falltime components, the method comprising:
   sensing a voltage value representative of a voltage value on the capacitive load;
   substantially continuously comparing the sensed voltage value with the target voltage waveform;
   supplying power from an input to an output for charging a capacitive load to obtain a peak voltage and average rise slew rate in continuous response to the comparison of the sensed voltage value with the target voltage waveform;
   discharging the capacitive load to obtain an average fall slew rate in continuous response to the comparison of the sensed voltage value with the target voltage waveform; and
   returning the discharged power from the capacitive load to the input.

2. A method for driving a capacitive load according to claim 1, further comprising:
   enabling a first charge path between a power supply and an inductance and a first discharge path from the inductance so that the inductance is charged from the power supply;
   disabling the first charge path and selectively enabling and disabling the first discharge path so that current flows from the inductance to the capacitive load via a second charge path to achieve the average rise slew rate;
   selectively enabling and disabling a second discharge path so that the capacitive load discharges via a primary side of a transformer to achieve the average fall rate, whereby power is induced on a secondary side of the transformer and is used to recharge the power supply.

3. A method for driving a capacitive load according to claim 2, further comprising: comparing the current on the first discharge path with a predetermined set current value and selectively enabling and disabling the first charge path so as to attempt to maintain a predetermined level of charge on the inductance.

4. A method for driving a capacitive load according to claim 2, further comprising: comparing the charge on the load with the target voltage waveform and selectively disabling the first discharge path and disabling the second discharge path so as to charge the capacitive load.

5. A drive circuit for driving a capacitive load using a target voltage waveform, the target waveform having a trace comprising a peak voltage and an average voltage risetime component and average voltage falltime component, wherein the trace comprises at least one voltage step on each of the voltage risetime and falltime components, the circuit comprising:
   an input for coupling to a power supply;
   an inductance having a first electrode connected to the input via a first charge path including a first switching device and further connected to ground via a second switching device, and a second electrode connected to a first discharge path including a third switching device and further connected to an output of the circuit for selectively charging a capacitive load via a second charge path;
   a transformer having a primary side connected between the output of the circuit and a second discharge path including a fourth switching device, the transformer further having a secondary side connected to the input;
   a voltage divider circuit for sensing the voltage on the capacitive load, the voltage divider circuit being connected to a fifth switching device for enabling the voltage divider circuit to be selectively reset;
   a differential comparator having a first input connected to the voltage divider circuit; and
   a controller connected to the differential comparator so that a second input of the differential comparator is connected to an output of the controller and an output of the differential comparator is connected to an input to the controller;

wherein the controller is connected to the first, second, third, fourth and fifth switching devices and in response to the target waveform:

enables the first charge path and the first discharge path so that the inductance is charged from the power supply;

disables the first charge and second discharge path and selectively enables and disables the first discharge path so that current flows from the inductance to the output for charging the capacitive load via the second charge path to achieve an average rise slew rate and peak voltage; and selectively enables and disables the second discharge path, so that the capacitive load discharges to the input via the primary side of the transformer to achieve the average fall slew rate.

6. A drive circuit according to claim 5, further comprising a differential current comparator having a first input connected to the first discharge path, a second input connected to the controller for receiving a predetermined set value from the controller and an output, whereby the differential current comparator compares the current on the first discharge path with the predetermined set value, whereby a signal from the output of the differential current comparator is capable of controlling the first switching device to attempt to maintain a predetermined level of charge on the inductance.

7. A drive circuit according to claim 5, wherein the second input of the differential comparator connected to the controller receives the target waveform from the controller and the differential comparator compares the voltage on the capacitive load with the target waveform and, whereby a signal from the output of the differential comparator is capable of controlling the first, second, third, fourth and fifth switching devices to control the charging and discharging of the capacitive load.

8. A drive circuit according to claim 5, further comprising a capacitor in parallel with the capacitive load.

9. A drive circuit according to claim 5, wherein a blocking component is connected between the first charge path and ground.

10. A drive circuit according to claim 9, wherein the blocking component is a semiconductor device.

11. A drive circuit according to claim 10, wherein the blocking component is a diode.

12. A drive circuit according to claim 9 wherein the blocking component is a MOSFET transistor.

13. A drive circuit according to claim 5, wherein the first, second, third, fourth and fifth switching devices are semiconductor devices.

14. A drive circuit according to claim 5, wherein the first, second, third, fourth and fifth switching devices are MOSFET transistors.

15. A drive circuit according to claim 5 wherein the fifth switching device selectively controls the voltage divider circuit.

16. A drive circuit according to claim 15, wherein the fifth switching device is controllable by the controller.

17. A drive circuit according to claim 5, wherein the controller is communicable with external devices.

18. A drive circuit according to claim 5, wherein the controller comprises a plurality of discrete devices communicable with each other.

19. A print head drive system comprising a drive circuit according to claim 5.

* * * * *